US009190606B2

(12) United States Patent
Liu et al.

(10) Patent No.: US 9,190,606 B2
(45) Date of Patent: Nov. 17, 2015

(54) PACKAGING FOR AN ELECTRONIC DEVICE

(71) Applicants: Shixi Louis Liu, Worcester, MA (US); Harianto Wong, Southborough, MA (US); Paul David, Bow, NH (US); John B. Sauber, Millbury, MA (US); Shaun D. Milano, Dunbarton, NH (US); Raguvir Kanda, North Attleboro, MA (US); Bruce Hemenway, Milford, MA (US)

(72) Inventors: Shixi Louis Liu, Worcester, MA (US); Harianto Wong, Southborough, MA (US); Paul David, Bow, NH (US); John B. Sauber, Millbury, MA (US); Shaun D. Milano, Dunbarton, NH (US); Raguvir Kanda, North Attleboro, MA (US); Bruce Hemenway, Milford, MA (US)

(73) Assignee: Allegro Micosystems, LLC, Worcester, MA (US)

( * ) Notice: Subject to any disclaimer, the term of this patent is extended or adjusted under 35 U.S.C. 154(b) by 77 days.

(21) Appl. No.: 13/834,617

(22) Filed: Mar. 15, 2013

(65) Prior Publication Data
US 2014/0264678 A1 Sep. 18, 2014

(51) Int. Cl.
H01L 43/02 (2006.01)
H01L 43/06 (2006.01)
H01L 43/04 (2006.01)
H01L 21/48 (2006.01)
(Continued)

(52) U.S. Cl.
CPC .............. *H01L 43/04* (2013.01); *G01R 15/207* (2013.01); *G01R 33/0052* (2013.01); *G01R 33/09* (2013.01); *H01L 21/4828* (2013.01); *G01R 15/202* (2013.01); *H01L 23/49548* (2013.01); *H01L 24/13* (2013.01); *H01L 24/16* (2013.01); *H01L 24/81* (2013.01); *H01L 43/065* (2013.01); *H01L 2224/131* (2013.01); *H01L 2224/16245* (2013.01); *H01L 2224/81801* (2013.01); *H01L 2924/15162* (2013.01)

(58) Field of Classification Search
CPC ....... H01L 43/04; H01L 43/06; H01L 43/065; G01R 33/0047
USPC .............................. 324/117 H, 251; 257/427
See application file for complete search history.

(56) References Cited

U.S. PATENT DOCUMENTS 4,425,596 A 1/1984 Satou
4,893,073 A 1/1990 McDonald et al.
(Continued)

FOREIGN PATENT DOCUMENTS

DE 4 141 386 A1 6/1993
DE 4 141 386 C2 6/1993
(Continued)

OTHER PUBLICATIONS

EP Official Communication; dated May 16, 2008; for EP Pat. App. No. 06 770 974.1-2216; 4 pages.
(Continued)

Primary Examiner — Whitney T Moore
Assistant Examiner — Scott Stowe
(74) Attorney, Agent, or Firm — Daly, Crowley, Mofford & Durkee, LLP

(57) ABSTRACT

In one aspect, a method includes processing a metal substrate, performing a first etch on a first surface of the metal substrate to form, for an integrated circuit package, secondary leads and a curved component having two primary leads and performing a second etch, on a second surface of the substrate opposite the first surface, at locations on the secondary leads and locations on the curved component to provide a locking mechanism. Each primary lead located at a respective end of the curved component.

12 Claims, 7 Drawing Sheets

(51) Int. Cl.
*G01R 33/00* (2006.01)
*G01R 33/09* (2006.01)
G01R 15/20 (2006.01)
H01L 23/495 (2006.01)
H01L 23/00 (2006.01)

(56) References Cited

U.S. PATENT DOCUMENTS

| | | |
|---|---|---|
| 5,041,780 A | 8/1991 | Rippel |
| 5,124,642 A | 6/1992 | Marx |
| 5,247,202 A | 9/1993 | Popovic et al. |
| 5,442,228 A | 8/1995 | Pham et al. |
| 5,561,366 A | 10/1996 | Takahashi et al. |
| 5,615,075 A | 3/1997 | Kim |
| 6,005,383 A | 12/1999 | Savary et al. |
| 6,150,714 A | 11/2000 | Andreycak et al. |
| 6,252,389 B1 | 6/2001 | Baba et al. |
| 6,316,931 B1 | 11/2001 | Nakagawa et al. |
| 6,323,634 B1 | 11/2001 | Nakagawa et al. |
| 6,356,068 B1 | 3/2002 | Steiner et al. |
| 6,411,078 B1 | 6/2002 | Nakagawa et al. |
| 6,424,018 B1 | 7/2002 | Ohtsuka |
| 6,445,171 B2 | 9/2002 | Sandquist et al. |
| 6,462,531 B1 | 10/2002 | Ohtsuka |
| 6,545,456 B1 | 4/2003 | Radosevich et al. |
| 6,566,856 B2 | 5/2003 | Sandquist et al. |
| 6,583,572 B2 | 6/2003 | Veltrop et al. |
| 6,642,705 B2 | 11/2003 | Kawase |
| 6,667,682 B2 | 12/2003 | Wan et al. |
| 6,683,448 B1 | 1/2004 | Ohtsuka |
| 6,727,683 B2 | 4/2004 | Goto et al. |
| 6,759,841 B2 | 7/2004 | Goto et al. |
| 6,781,359 B2 | 8/2004 | Stauth et al. |
| 6,791,313 B2 | 9/2004 | Ohtsuka |
| 6,812,687 B1 | 11/2004 | Ohtsuka |
| 6,841,989 B2 | 1/2005 | Goto et al. |
| 6,853,178 B2 | 2/2005 | Hayat-Dawoodi |
| 6,867,573 B1 | 3/2005 | Carper |
| 6,921,955 B2 | 7/2005 | Goto et al. |
| 6,989,665 B2 | 1/2006 | Goto |
| 6,995,315 B2 | 2/2006 | Sharma et al. |
| 7,006,749 B2 | 2/2006 | Illich et al. |
| 7,075,287 B1 | 7/2006 | Mangtani et al. |
| 7,166,807 B2 | 1/2007 | Gagnon et al. |
| 7,248,045 B2 | 7/2007 | Shoji |
| 7,259,545 B2 | 8/2007 | Stauth et al. |
| 7,348,724 B2 | 3/2008 | Lee |
| 7,358,724 B2 | 4/2008 | Taylor et al. |
| 7,476,816 B2 | 1/2009 | Doogue et al. |
| 7,598,601 B2 | 10/2009 | Taylor et al. |
| 7,709,754 B2 | 5/2010 | Doogue et al. |
| 8,080,994 B2 | 12/2011 | Taylor et al. |
| 2001/0028115 A1 | 10/2001 | Yanagawa et al. |
| 2002/0179987 A1 | 12/2002 | Meyer et al. |
| 2005/0029638 A1 | 2/2005 | Ahn et al. |
| 2005/0030018 A1 | 2/2005 | Shibahara et al. |
| 2005/0045359 A1 | 3/2005 | Doogue et al. |
| 2005/0230843 A1 | 10/2005 | Williams |
| 2006/0002147 A1 | 1/2006 | Hong et al. |
| 2006/0071655 A1 | 4/2006 | Shoji |
| 2006/0091993 A1 | 5/2006 | Shoji |
| 2006/0114098 A1 | 6/2006 | Shoji |
| 2006/0145690 A1 | 7/2006 | Shoji |
| 2006/0170529 A1 | 8/2006 | Shoji |
| 2006/0181263 A1 | 8/2006 | Doogue et al. |
| 2006/0219436 A1 | 10/2006 | Taylor et al. |
| 2006/0291106 A1 | 12/2006 | Shoji |
| 2007/0044370 A1 | 3/2007 | Shoji |
| 2007/0076332 A1 | 4/2007 | Shoji |
| 2007/0090825 A1 | 4/2007 | Shoji |
| 2007/0096716 A1 | 5/2007 | Shoji |
| 2007/0170533 A1 | 7/2007 | Doogue et al. |
| 2007/0188946 A1 | 8/2007 | Shoji |
| 2007/0279053 A1 | 12/2007 | Taylor et al. |
| 2008/0297138 A1 | 12/2008 | Taylor et al. |
| 2010/0156394 A1 | 6/2010 | Ausserlechner et al. |
| 2011/0221429 A1 | 9/2011 | Tamura |

FOREIGN PATENT DOCUMENTS

| | | |
|---|---|---|
| EP | 0 867 725 A1 | 9/1998 |
| EP | 1 107 327 A2 | 6/2001 |
| EP | 1 107 328 A2 | 6/2001 |
| EP | 1 111 693 A2 | 6/2001 |
| EP | 1 180 804 A2 | 2/2002 |
| EP | 1281974 A2 | 2/2003 |
| JP | 61-71649 | 4/1986 |
| JP | 04-364472 | 12/1992 |
| JP | 63-191069 | 8/1998 |
| JP | 2000174357 | 6/2000 |
| JP | 2001165963 | 6/2001 |
| JP | 2001174486 | 6/2001 |
| JP | 2001221815 | 8/2001 |
| JP | 2001230467 | 8/2001 |
| JP | 2001339109 | 12/2001 |
| JP | 2002026419 | 1/2002 |
| JP | 2002040058 | 2/2002 |
| JP | 2002202326 | 7/2002 |
| JP | 2002202327 | 7/2002 |
| JP | 2002-267692 | 9/2002 |
| JP | 5255046 | 4/2013 |
| WO | WO 99/14605 | 3/1999 |
| WO | WO 03/038452 A1 | 5/2003 |
| WO | WO 2005/026749 A1 | 3/2005 |
| WO | WO 2006/130393 | 12/2006 |

OTHER PUBLICATIONS

Response to EP Official Communication; dated Nov. 26, 2008; for EP Pat. App. No. 06 770 974.1; 44 pages.
EPC Communication under Rule 71(e); dated Ap. 27, 2009; for EP Pat. App. No. 06 770 974.1-2216; 6 pages.
PCT International Preliminary Report on Patentability and Written Opinion of the ISA; dated Dec. 13, 2007; for PCT Pat. App. PCT/US2006/019953; 7 pages.
Letter to Yuasa and Hara including a First Set of Draft Claim Amendments for Consideration and a Second Set of Draft Claim Amendments for Consideration; dated Jul. 18, 2011; for JP Pat. App. No. 2008-513632; 14 pages.
Letter from Yuasa and Hara including a response as filed on Aug. 18, 2011 for JP Pat. App. No. 2008-513632; 9 pages.
Japanese Office Action dated May 16, 2011 for JP Pat. App. No. 2009-151851; 1 sheets.
Japanese Office Action dated May 19, 2011 for JP Pat. App. No. 2010-281774; 2 sheets.
Japanese Office Action dated May 19, 2011 for JP Pat. App. No. 2010-281804; 2 sheets.
Japanese Office Action dated May 19, 2011 for JP Pat. App. No. 2010-281828; 2 sheets.
Japanese Office Action dated May 19, 2011 for JP Pat. App. No. 2008-513632; 2 sheets.
Japanese Office Action dated May 19, 2011 for JP Pat. App. No. 2010-281841; 2 sheets.
EP Office Action dated Feb. 23, 2011 for EP 09 000 121.5.
EP Search Report of the EPO for EP10183958.7 dated Feb. 4, 2011.
Japanese Office Action dated Sep. 21, 2010 for JP2008-513632; English Translation; 2 pages.
Korean Response to Office Action dated Jul. 22, 2010 for KR 10-2006-7002842; English Translation; 11 pages.
Korean Amendment to Office Action dated Jul. 22, 2010 for KR 10-2006-7002842; English Translation; 7 pages.
Korean Office Action (with English translation) dated Jul. 22, 2010 for KR App. No. 10-2006-7002842.
Clemson University Vehicular Electronics Laboratory; "Electromagnetic Compatibility;" Internet: http://www.cvel.clemson.edu/emc/tutorials/Shielding02/Practical_Shielding.html; Jan. 7, 2010; 9 sheets.
Wikipedia; "Electromagnetic Field;" internet: http://en.wikipedia.org/wiki/Electromagnetic_field; Jan. 7, 2010; 7 sheets.

(56) References Cited

OTHER PUBLICATIONS

Wikipedia; "Electromagnetic Shielding;" internet: http://en.wikipedia.org/wiki/Electromagnetic_shielding; Jan. 7, 2010; 3 sheets.
Wikipedia; "Magnetic Field;" internet: http://en.wikipedia.org/wiki/Magnetic_field; Jan. 7, 2010; 25 sheets.
EP Search Report of the EPO for EP09000121.5 dated Feb. 10, 2010.
EP Search Report of the EPO for EP09000123.1 dated Jan. 22, 2010.
EP Office Action dated Jun. 17, 2009; for EP Pat. App. No. 048163162.4.
Lee et al.; "Fine Pitch Au-SnAgCu Joint-in-via Flip-Chip Packaging:" IEEE 9th Electronics Packaging Technology Conference, Dec. 10-12, 2007; pp. 1-7.
Chinese Office Action for Chinese National Stage Application No. CN 2004 80024296.5 dated Apr. 29, 2009 (PCT/US2004/009908).
Chinese Office Action for Chinese National Stage Application No. CN 2004 80024296.5 dated Sep. 26, 2008 (PCT/US2004/009908).
Chinese Office Action for Chinese National Stage Application No. CN 2004 80024296.5 dated May 6, 2008 (PCT/US2004/009908).
Chinese Office Action for Chinese National Stage Application No. CN 2004 80024296.5 dated Nov. 23, 2007 (PCT/US2004/009908).
European Office Action for European National Stage Application No. EP 04816162.4 dated Jan. 2, 2008 (PCT/US2004/009908).
European Office Action for European National Stage Application No. EP 04816162.4 dated Jun. 27, 2007 (PCT/US2004/009908).
Japanese Final Office Action for Japanese National Stage Application No. JP 2006-524610 dated Apr. 23, 2009 (PCT/US2004/009908).
Japanese Office Action for Japanese National Stage Application No. JP 2006-524610 dated Sep. 10, 2008 (PCT/US2004/009908).
Japanese Office Action for Japanese National Stage Application No. JP 2006-524610 dated Jul. 10, 2008 (PCT/US2004/009908).
PCT Search Report and Written Opinion of the ISA for PCT/US2004/009908 dated Aug. 16, 2004.
PCT Search Report and Written Opinion of the ISA for PCT/US2006/019953 dated Sep. 25, 2006.
Mosbarger et al.; "The Effects of Materials and Post-Mold Profiles on Plastic Encapsulated Integrated Circuits:" IEEE/IRPS; Apr. 1994; pp. 93-100.
Steiner, et al.; "Fully Packaged CMOS Current Monitor Using Lead-on-Chip Technology:" Physical Electronics Laboratory, ETH Zurich, CH8093 Zurich, Switzerland; No. 0-7803-4412-X/98; IEEE 1998; pp, 603-608.
Taylor et al.; "Current Sensor;" U.S. App. No. 12/171/651, filed Jul. 11, 2008.
Notification of Transmittal of the International Search Report and Written Opinion of the ISA dated Jun. 2, 2014 (including the International Search Report and Written Opinion) corresponding to International Appl. No. PCT/US2014/018525, 5 pages.
Response to Japanese Office Action dated May 16, 2011 as filed on Sep. 28, 2011 for JP Pat. App. No. 2009-151851, 8 pages.
Office Action dated Jan. 19, 2012 for JP Pat. App. No. 2009-151851, 9 pages.
Response to Office Action dated Jan. 19, 2012 as filed on Mar. 15, 2012 for JP Pat. App. No. 2009-151851, 10 pages.
Response (w/o English Translation) to Office Action dated May 19, 2011 as filed on Aug. 18, 2011 for JP Pat. Appl. No. 2010-281774, 3 pages.
Official Action dated Feb. 6, 2012 for JP Pat. Appl. No. 2010-281774, 6 pages.
Response to Office Action dated Feb. 6, 2012 as filed on Apr. 24, 2014 for JP Pat. Appl. No. 2010-281774, 41 pages.
Office Action with mailing data of Sep. 20, 2012 for JP Pat. Appl. No. 2010-281774, 6 pages.
Response to Office Action with mailing data of Sep. 20, 2012 as filed Dec. 20, 2012 for JP Pat. Appl. No. 2010-281774, 9 pages.
Notice of Allowance dated Apr. 4, 2013 corresponding to JP Pat. Appl. No. 2010-281774, 4 pages.
Response to Office Action dated May 19, 2011 as filed on Sep. 21, 2011 for JP Pat. Appl. No. 2010-281804, 6 pages.
Office Action dated Feb. 6, 2012 corresponding to JP Pat. Appl. No. 2010-281804, 6 pages.
Notice of Allowance dated Jan. 20, 2013 for Korean Appl. No. 10-20007-7028301; 12 pages.
Response to Japanese Office Action dated February 23, 2011 as filed on Jun. 22, 2011 for EP 09000121.5, 18 pages.
European Office Action dated Dec. 9, 2011 for EP Appl. No. 09000121.5; 77 pages.
European Office Action dated Feb. 1, 2013 for EP Appl. No. 09000123.1; 5 pages.
European Office Action dated Aug. 23, 2012 for RP Appl. No. 09000122.3.
Japanese Office Action dated Dec. 14, 2011 for JP Appl. No. 2009-151851.
Japanese Office Action dated Sep. 14, 2012 for JP Appl. No. 2009-151851.
Japanese Office Action dated Feb. 6, 2012 for JP Appl. No. 2010-281804.
Notice of Allowance dated Mar. 26, 2013 for JP App. No. 2010-281804.
Response to Japanese Office Action dated Feb. 6, 2012 as filed on May 30, 2012 for JP Appl. No. 2010-281804.
Japanese Office Action dated Sep. 20, 2012 for JP Appl. No. 2010-281804.
Response to Japanese Office Action dated Sep. 20, 2012 as filed on Dec. 4, for JP Appl. No. 2010-281804.
Response to Japanese Office Action filed on Aug. 18, 2011 for JP Appl. No. 2010-281828; 4 pages.
Notice of Allowance dated Dec. 8, 2014 for JP Appl. No. 2010-281828.
Response to Japanese Office Action dated Jun. 17, 2011 as filed on Aug. 18, 2011 for JP Appl. No. 2008-513632.
Response to Japanese Office Action dated Feb. 6, 2012 for JP Appl. No. 2008-513632.
Response to Japanese Office Action dated Feb. 6, 2012 as filed on May 22, 2012 for JP Appl. No. 2008-513632.
Japanese Office Action dated Sep. 20, 2012 for JP Appl. No. 2008-513632.
Response to Japanese Office Action dated Sep. 20, 2012 as filed on Mar. 21, 2013 for JP Appl. No. 2008-513632.
Notice of Allowance dated Jan. 15, 2014 for JP Appl. No. 2008-513632.
Response to Japanese Office Action dated May 19, 2011 as filed on Aug. 18, 2011 for JP Appl. No. 2010-281841.
Japanese Office Action dated Feb. 6, 2012 for JP Appl. No. 2010-281841.
Response to Japanese Office Action dated Feb. 6, 2012 as filed on May 15, 2012 for JP Appl. No. 2010-281841.
Japanese Office Acton dated Sep. 20, 2012 for JP Appl. No. 2010-281841.
Response Japanese Office Action dated Sep. 20, 2012 as filed on Dec. 6, 2012 for JP Appl. No. 2010-281841.
Notice of Allowance dated Mar. 25, 2013 for JP Appl. No. 2010-281841.
U.S. Appl. No. 11/140,250, filed May 27, 2005.
U.S. Appl. No. 11/144,970, filed Jun. 3, 2005.
U.S. Appl. No. 11/336,602, filed Jan. 20, 2006.
U.S. Appl. No. 11/401,160, filed Apr. 10, 2006.
U.S. Appl. No. 12/171,651, filed Jul. 11, 2008.
U.S. Appl. No. 12/261,629, filed Oct. 30, 2008.
PCT International Preliminary Amendment and Written Opinion dated Sep. 24, 2015 corresponding to International Application No. PCT/US2014/018525; 10 pages.

PACKAGING FOR AN ELECTRONIC DEVICE

BACKGROUND

Techniques for integrated circuit (IC) packaging are well known in the art. In general, a semiconductor die is cut from a wafer, processed, and attached to a lead frame. As is known in the art, ICs are typically overmolded with a plastic or other material to form the package. After assembly of the IC package, the package may then be placed on a circuit board.

SUMMARY

In one aspect, a method includes processing a metal substrate, performing a first etch on a first surface of the metal substrate to form, for an integrated circuit package, secondary leads and a curved component having two primary leads and performing a second etch, on a second surface of the substrate opposite the first surface, at locations on the secondary leads and locations on the curved component to provide a locking mechanism. Each primary lead located at a respective end of the curved component.

In another aspect, an integrated circuit (IC) package includes a die, secondary leads, a curved component attached to the die and having two primary leads and a housing to house the die. Each primary lead is located at a respective end of the curved component. At least some of the secondary leads are attached to the die. At least one of the secondary leads includes a first recessed portion. The curved component includes a second recessed portion. At least one of the first recessed portion or the second recessed portion forms a locking mechanism.

In a further aspect, a current sensor includes a die that includes at least two magnetic field sensing elements and a curved component at least partial wrapped around one of the at least two magnetic field sensing elements and attached to the die. The curved component has a first end and a second end and is configured to receive current at one of the first end or the second end.

BRIEF DESCRIPTION OF THE DRAWINGS

The foregoing features of the invention, as well as the invention itself may be more fully understood from the following detailed description of the drawings, in which.

DETAILED DESCRIPTION

Described herein are techniques to fabricate a package such as a plastic small outline flat (PSOF) lead package, for example. The fabrication of the package includes fabricating leads. The leads are fabricated using a second etch process to allow easy detachability from a lead frame. The leads are also fabricated, using the second etch process, to include recessed surfaces that contribute to a locking mechanism to enable the leads to be secured with the mold compound of the package.

Figure 1:
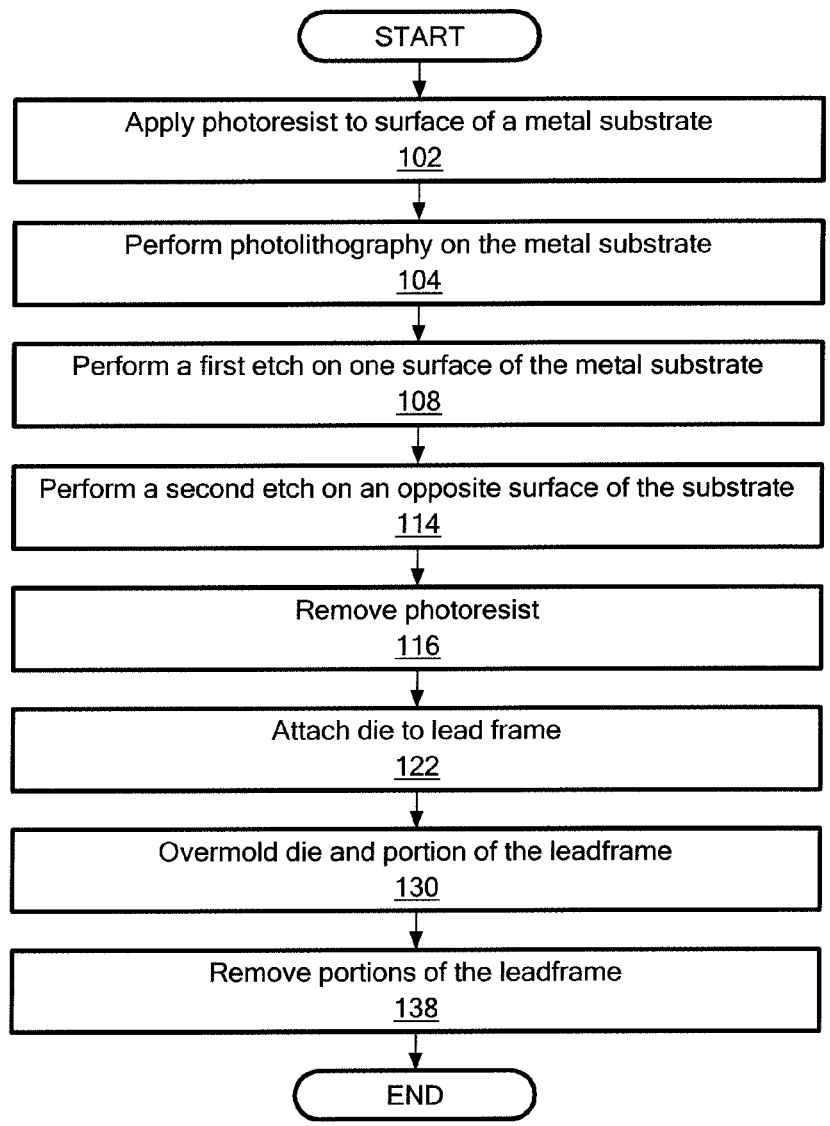
FIG. 1 is a flowchart of an example of a process to fabricate a package for an electronic circuit.

Referring to FIG. 1, an example of a process to fabricate leads for use in a package for an electronic circuit is a process 100. Process 100 applies a photoresist to surface of a metal substrate (102). In one example, the metal substrate is a copper substrate.

Process 100 performs photolithography on the metal substrate (104). In one example, a photoresist is applied to both surfaces of the metal substrate. A first mask is placed over a top surface of the metal substrate and the exposed portions of the photoresist are radiated with an ultraviolet (UV) light. A second mask is placed on a bottom surface of the metal substrate and the exposed portions of the photoresist are radiated with the UV light. The second mask exposes less portions of the photoresist and as will be described herein, these exposed portions contribute to fabricating recessed portions of the leads.

The photoresist exposed on both surfaces to the UV light is generally removed by a developer solution leaving exposed portions of the metal substrate in a pattern corresponding to the mask used for that surface. In some examples, the photoresist is baked prior to applying the first or second mask. In other examples, the photoresist is baked after the developer solution is applied. While use of positive photoresist is described herein, one of ordinary skill in the art would recognize that the photolithography process may also be performed using negative photoresist instead.

Figure 2A:
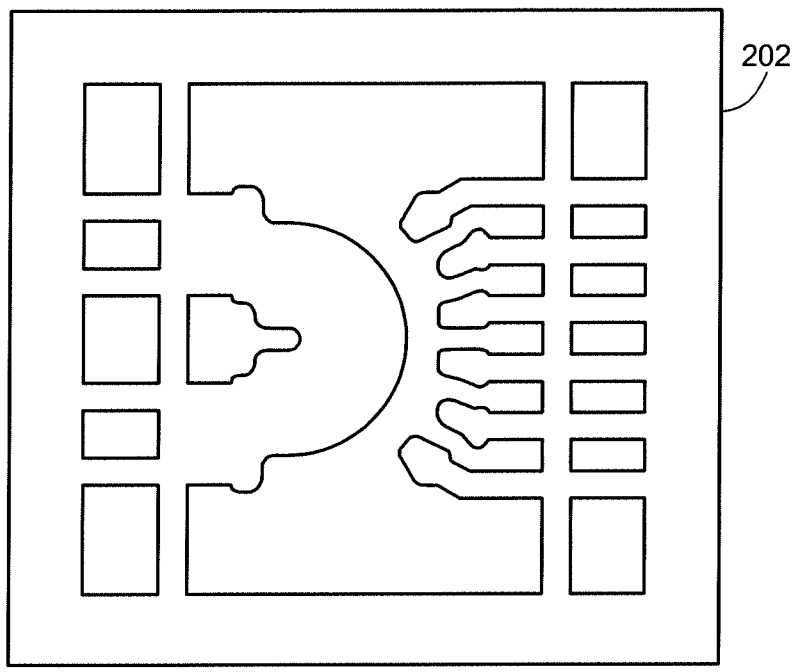
FIG. 2A is a diagram of a top view of a lead frame after etching.

Process 100 performs a first etch on one surface of the metal substrate (108). For example, the exposed portions of the metal substrate are etched away. The result of the first etch is a lead frame 202 depicted in FIG. 2A. The first etch may be performed using a dry etch or a wet etch process.

Process 100 performs a second etch on an opposite surface of the metal substrate (114). For example, the exposed portions of the metal substrate are etched. The second etch is performed to a depth that is less than a depth performed by the first etch leaving some portion of the metal to form the recessed portions. In one example, the second etch removes the metal down to a depth that is about 40% to 60% of a depth removed by the first etch. In one particular example, the second etch removes the metal down to a depth that is about 50% of a depth removed by the first etch. The second etch may be performed using a dry etch or a wet etch process.

Figure 2B:
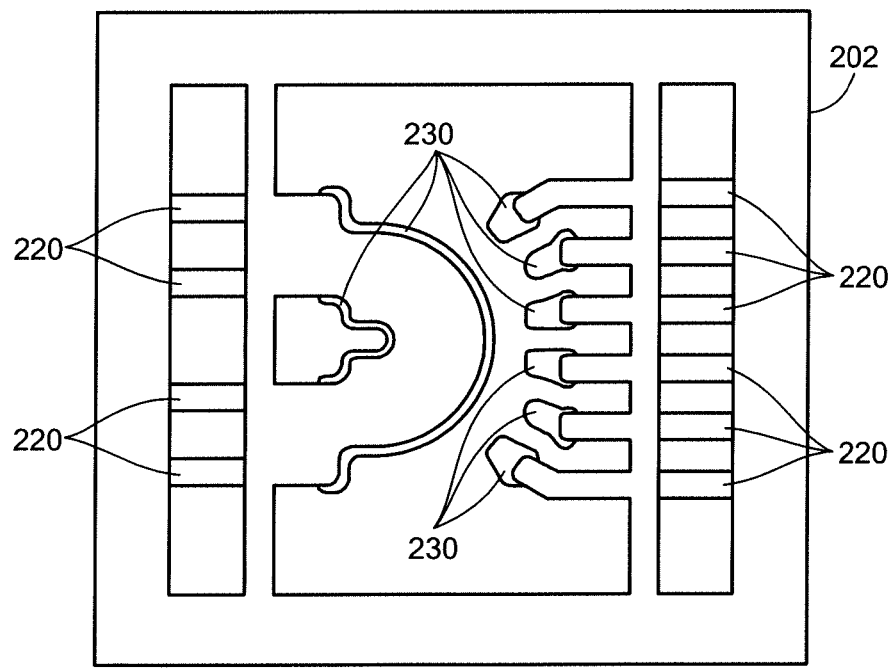
FIG. 2B is a diagram of a bottom view of the lead frame after etching.
Figure 2C:
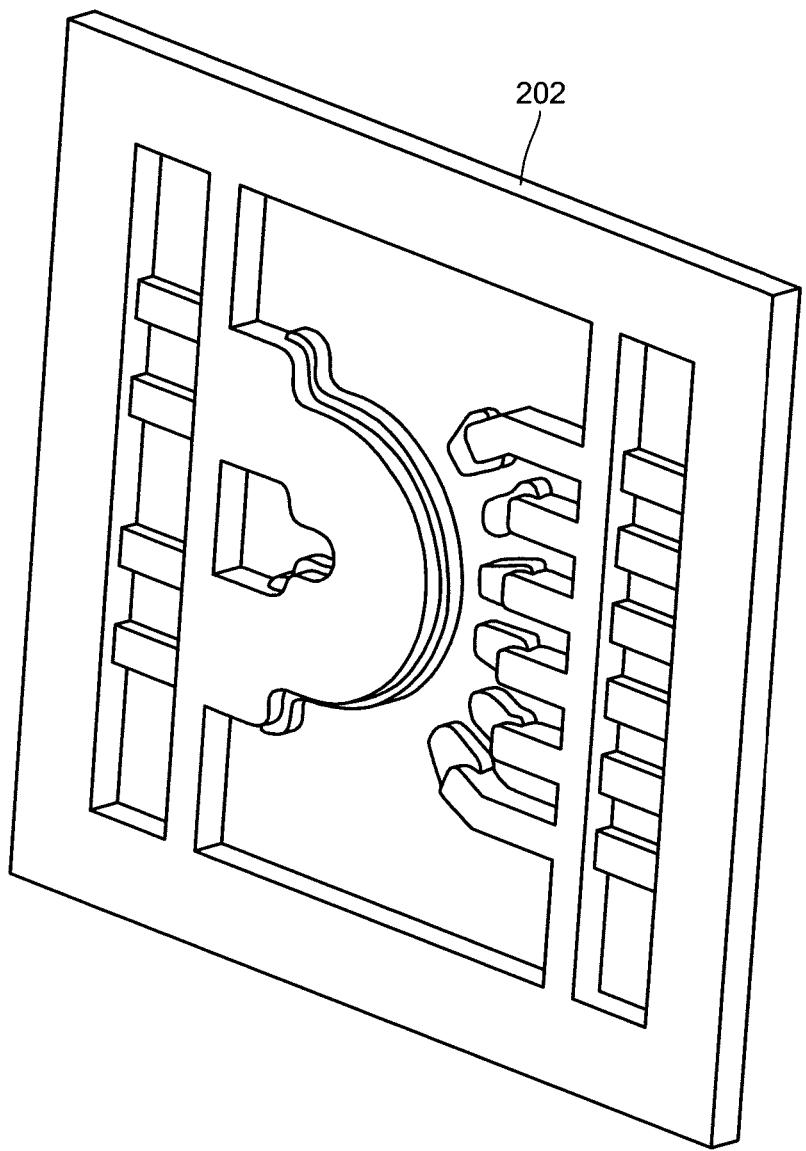
FIG. 2C is a diagram of an angled view of the bottom of the lead frame after etching.

The result of the second etch is a lead frame 202 depicted in FIGS. 2B and 2C from a bottom or angled bottom view. The portions 220 and 230 are the areas that are etched during the second etch. After the second etch, the portions 220 are used to easily detach leads from the lead frame 202. The portions 230 are used as part of a locking mechanism to lock the leads with the mold compound as described in FIG. 4B, for example.

It is understood by one of ordinary skill in the art that the first etch and the second etch may be performed concurrently. For example, both the top and bottom surfaces may be patterned with a respective mask and exposed to UV light prior to etching both the top surface and the bottom surface concurrently.

Process 100 removes the photoresist (116). For example, positive photoresist is removed using organic solvents such as acetone and negative photoresist is removed using hot sulfuric acid immersion, for example. In other examples, a photoresist stripper is used.

Process 100 attaches a die to a lead frame (122). For example, a die is attached to a curved component 306 and secondary leads 304b-304d (FIGS. 3A to 3C) using solder bumps. In one example, the die is oriented in a flip-chip arrangement with an active surface of the die which supports electrical components adjacent to the lead frame.

Process 100 overmolds the die and a portion of the lead frame (130) and removes portions of the lead frame (138). For example, the mold compound engages the recessed portions formed by the second etch to form a locking mechanism, an example of which is shown in FIG. 4B. In one example, the overmold material forms a housing for the package. The overmold material may be a plastic or other electrically insulative and protective material to form an integrated circuit (IC) package. Suitable materials for the non-conductive mold material include thermoset and thermoplastic mold compounds and other commercially available IC mold compounds.

Figure 3A:
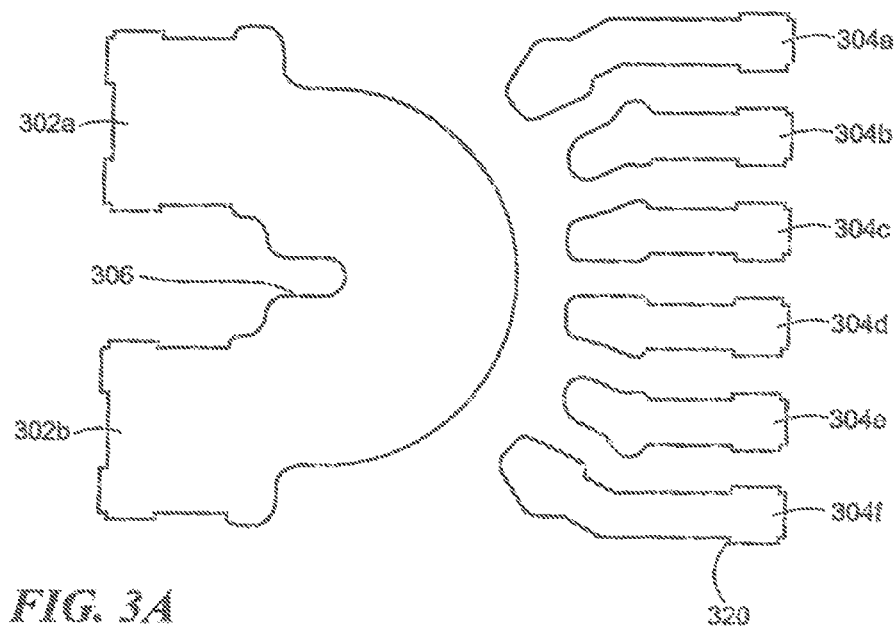
FIG. 3A is a diagram of a top view of leads detached from the lead frame.
Figure 3B:
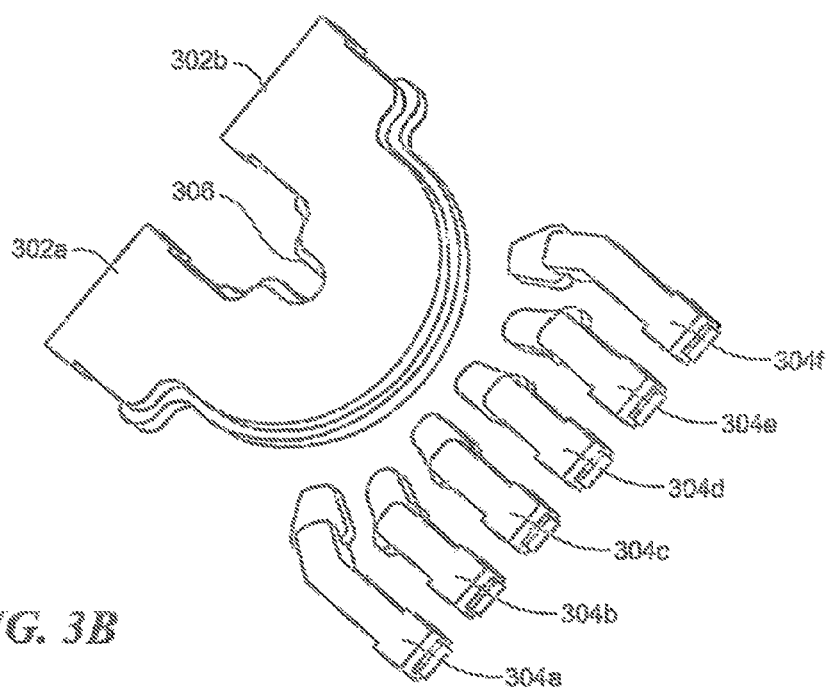
FIG. 3B is a diagram of an angled view of the bottom of the leads detached from the lead frame.
Figure 3C:
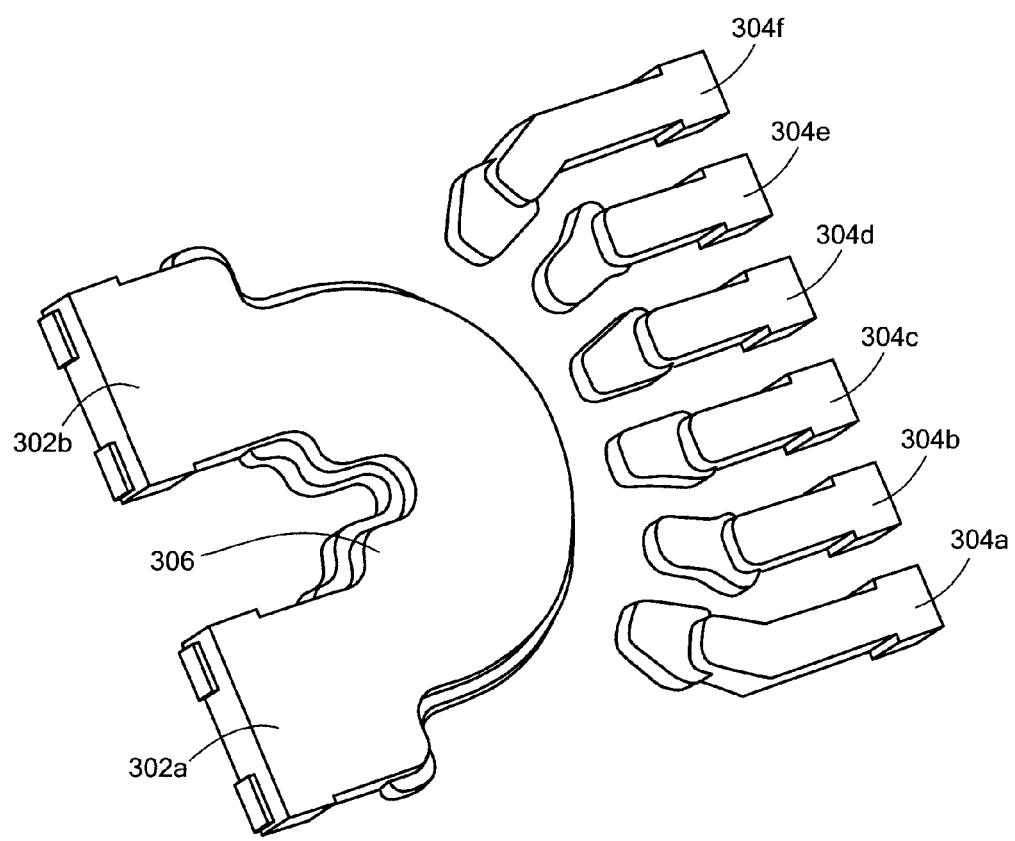
FIG. 3C is a diagram of an angled view of the bottom of the leads detached from the lead frame.

Referring to FIGS. 3A to 3C, the process 100 is used to fabricate a lead frame 202 including primary leads 302a, 302b that are part of a curved component 306 and secondary leads 304a-304f. In one example, the curved component 306 is in a shape of a half circle. The primary leads 302a, 302b are configured to carry current of about 100 amps. The outer two secondary leads 304a, 304f bend at an angle towards the primary leads. Each of the secondary leads includes corners such as a corner 320 on secondary lead 304f in FIG. 3A. The corner 320 contributes to a more effective soldering of the secondary lead to other objects (e.g., a printed circuit board) because the solder wicks easily in the corner 320.

Figure 4A:
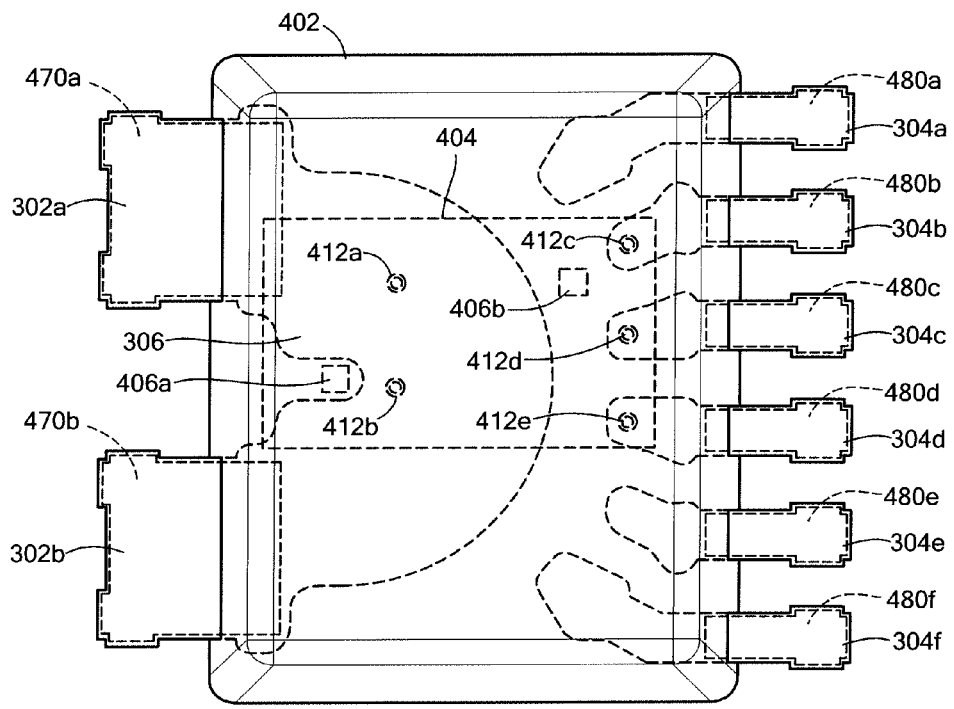
FIG. 4A is a diagram of an example of an implementation of the leads in a plastic small outline flat (PSOF) lead package with a die.
Figure 4B:
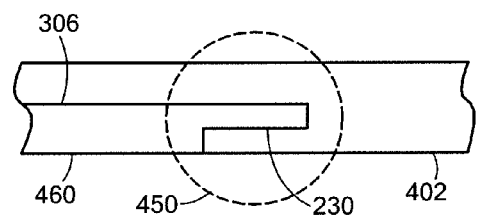
FIG. 4B is a cross-sectional view of a locking mechanism in the PSOF lead package in FIG. 4A.

FIG. 4A is an example of the primary and secondary leads used in a PSOF lead package. For example, the PSOF lead package includes the mold compound 402, the die 404, the curved component 306 with primary leads 302a, 302b, and secondary leads 304a-304f. The curved component 306 is attached to the die 404 with solder bumps 412a, 412b, for example. The secondary leads 304b-304d are attached to the die 404 with solder bumps 412c, 412d, for example. The die 404 includes a Hall effect sensor 406a and a Hall effect sensor 406b. In one example, the curved component 306 at least partially wraps around the Hall effect sensor 406a.

Each area of pads attached to the primary leads 302a, 302b are generally larger than each area of pads attached to each of the secondary leads 304a-304f. For example, pads 470a, 470b are attached to the primary leads 302a, 302b, respectively. The pads 480a-480f are attached to the secondary leads 480a-480f. In one example, each area of pads 470a, 470b is at least 4 times larger than each area of pads 480a-480f. In other examples, each area of pads 470a, 470b is at least 5 to 10 times larger than each area of pads 480a-480f.

FIG. 4B depicts an example of a locking mechanism. For example, a curved component 306 includes the recessed portion 230 which forms a locking mechanism 450 with a mold compound 402. While FIG. 4A depicts a curved component 306, the locking mechanism is also provided by the recessed portion 230 for secondary leads 304a-304f in a manner similar to what is depicted in FIG. 4B. The curved component 306 also forms part of a bottom portion 460 of the PSOF lead package. The primary leads 302a, 302b and the secondary leads 304a-304f also form part of the bottom portion 460 of the PSOF lead package. The exposed leads 302a, 302b, 304a-304f contribute to an easy soldering process.

Figure 5:
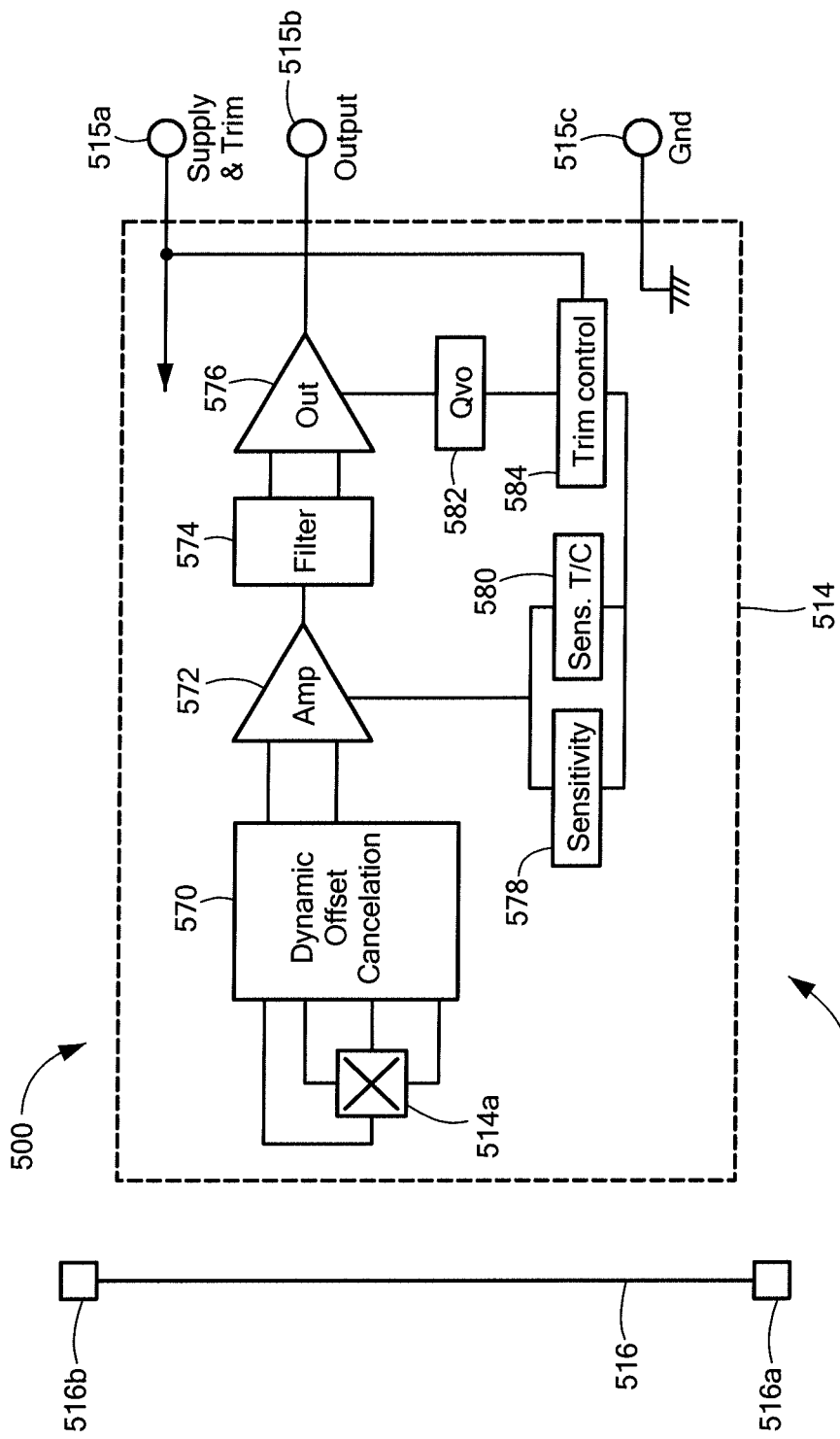
FIG. 5 is an electronic circuit diagram of an example of a die that may be used in a PSOF lead package.

FIG. 5 depicts a schematic representation of an example of a die that may be used in a PSOF lead package. For example, the die in FIG. 5 is a magnetic field sensor such as a current sensor 500. The current sensor 500 includes a conductor 516 represented by a line having circuit board mounting mechanisms 516a, 516b, such as may take the form of the above-described curved component 306. An illustrative magnetic field sensor 512 includes the sensor die 514 and leads 515, here labeled 515a, 515b, and 515c. Lead 515a provides a power connection to the Hall effect current sensor 512, lead 515b provides a connection to the current sensor output signal, and lead 515c provides a reference, or ground connection to the current sensor.

The magnetic field sensor includes a magnetic field sensing element 514a such as a Hall effect element that senses a magnetic field induced by a current flowing in the conductor 516, producing a voltage in proportion to the magnetic field 564. The magnetic field sensing element 514a is coupled to a dynamic offset cancellation circuit 570, which provides a DC offset adjustment for DC voltage errors associated with the Hall effect element 514a. When the current through the conductor 516 is zero, the output of the dynamic offset cancellation circuit 570 is adjusted to be zero.

The dynamic offset cancellation circuit 570 is coupled to an amplifier 572 that amplifies the offset adjusted Hall output signal. The amplifier 572 is coupled to a filter 574 that can be a low pass filter, a high pass filter, a band pass filter, and/or a notch filter. The filter is selected in accordance with a variety of factors including, but not limited to, desired response time, the frequency spectrum of the noise associated with the magnetic field sensing element 514a, the dynamic offset cancellation circuit 570, and the amplifier 572. In one particular embodiment, the filter 574 is a low pass filter. The filter 574 is coupled to an output driver 576 that provides an enhanced power output for transmission to other electronics (not shown).

A trim control circuit 584 is coupled to lead 515a through which power is provided during operation. Lead 515a also permits various current sensor parameters to be trimmed, typically during manufacture. To this end, the trim control circuit 584 includes one or more counters enabled by an appropriate signal applied to the lead 515a.

The trim control circuit 584 is coupled to a quiescent output voltage (Qvo) circuit 582. The quiescent output voltage is the voltage at output lead 515b when the current through conductor 516 is zero. Nominally, for a unipolar supply voltage, Qvo is equal to Vcc/2. Qvo can be trimmed by applying a suitable trim signal through the lead 515a to a first trim control circuit counter within the trim control circuit 584 which, in turn, controls a digital-to-analog converter (DAC) within the Qvo circuit 582.

The trim control circuit 584 is further coupled to a sensitivity adjustment circuit 578. The sensitivity adjustment circuit 578 permits adjustment of the gain of the amplifier 572 in order to adjust the sensitivity of the current sensor 512. The sensitivity can be trimmed by applying a suitable trim signal through the lead 515a to a second trim control circuit counter within the trim control circuit 584 which, in turn, controls a DAC within the sensitivity adjustment circuit 578.

The trim control circuit 584 is further coupled to a sensitivity temperature compensation circuit 580. The sensitivity temperature compensation circuit 580 permits adjustment of the gain of the amplifier 572 in order to compensate for gain variations due to temperature. The sensitivity temperature compensation can be trimmed by applying a suitable trim signal through the lead 515a to a third trim control circuit counter within the trim control circuit 584 which, in turn, controls a DAC within the sensitivity temperature compensation circuit 580.

It will be appreciated by those of ordinary skill in the art that the circuitry shown in FIG. 5 is illustrative only of exemplary circuitry that may be associated with and integrated into a magnetic field sensor. In another embodiment, additional circuitry may be provided for converting the magnetic field sensor into a "digital fuse" which provides a high or low output signal depending on whether the magnetic field induced by the current through the conductor 516 is greater or less than a predetermined threshold level. The additional circuitry for this alternative embodiment can include a comparator and/or a latch, and/or a relay.

In one example, a tape may be applied to the current sensor to increase the isolation voltage if desired. For example, some prior current sensors employ a layer of underfill material or have an insulating tape between die and current conductor. Examples of such devices are described in U.S. Pat. Nos. 6,356,068 and 7,075,287 (the latter being assigned to Allegro Microsystems, Inc., Assignee of the subject application).

In other examples, a die that may be used in a PSOF lead package may include at least one of a magnetic field sensing element or a magnetic field sensor.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The processes described herein are not limited to the specific examples described. For example, the process 100 is not limited to the specific processing order of FIG. 1. Rather, any of the processing blocks of FIG. 1 may be re-ordered, combined or removed, performed in parallel or in serial, as necessary, to achieve the results set forth above.

Elements of different embodiments described herein may be combined to form other embodiments not specifically set forth above. Other embodiments not specifically described herein are also within the scope of the following claims.

What is claimed is:

1. An integrated circuit (IC) package comprising:
   a die;
   a housing to house the die;
   secondary leads, at least some of the secondary leads attached to the die, at least one of the secondary leads comprising a first recessed portion at a first end of the secondary lead and a first outside portion being substantially flat and extending away from the housing, the first outside portion comprising corners at a second end of the secondary lead, opposite the first end, configured to contribute to solder wicking; and
   a curved component attached to the die and having two primary leads substantially flat and extending away from the housing, each primary lead located at a respective end of the curved component, the curved component comprising a second recessed portion;
   wherein at least one of the first recessed portion or the second recessed portion forms a locking mechanism with the housing,
   wherein at least one surface of a secondary lead forms a bottom surface of the package, and
   wherein at least one surface of the curved component forms a bottom surface of the package.

2. The IC package of claim 1, wherein at least one of the secondary leads comprises a portion that is recessed between 40% and 60% of the total thickness of a lead.

3. The IC package of claim 2, wherein at least one of the secondary leads comprises a portion that is recessed about 50% of the total thickness of a lead.

4. The IC package of claim 1, wherein the curved component comprises a portion that is recessed between 40% and 60% of the total thickness of a lead.

5. The IC package of claim 4, wherein the curved component comprises a portion that is recessed about 50% of the total thickness of a lead.

6. The IC package of claim 1, wherein the curved component is in a shape of a semi-circle.

7. The IC package of claim 1, wherein the die comprises at least two Hall elements.

8. The IC package of claim 7, wherein the curved component wraps at least partially around one of the at least two Hall elements.

9. The IC package of claim 1 wherein the housing is at least 4×6 mm and the package is configured to provide current of about 100 amps to the die.

10. The IC package of claim 1 wherein each area of pads attached to a respective primary lead is at least four times larger than each area of pads attached to a respective secondary lead.

11. A current sensor disposed in a package, comprising:
    a die comprising at least two magnetic field sensing elements;
    a housing to house the die;
    secondary leads, at least some of the secondary leads attached to the die, at least one of the secondary leads comprising a first outside portion being substantially flat and extending away from the housing, the first outside portion comprising corners configured to contribute to solder wicking; and
    a curved component at least partial wrapped around one of the at least two magnetic field sensing elements and attached to the die, the curved component having a first end and a second end and configured to receive current at one of the first end or the second end, the first end and the second end being substantially flat and extending away from the housing, wherein at least one surface of a secondary lead forms a bottom surface of the package, and wherein at least one surface of the curved component forms a bottom surface of the package.

12. The current sensor of claim 11 wherein the at least two magnetic field sensing elements comprises at least one of a Hall effect element or a magnetoresistance element.

* * * * *

UNITED STATES PATENT AND TRADEMARK OFFICE
CERTIFICATE OF CORRECTION

PATENT NO. : 9,190,606 B2  
APPLICATION NO. : 13/834617  
DATED : November 17, 2015  
INVENTOR(S) : Shixi Louis Liu et al.

Page 1 of 1

It is certified that error appears in the above-identified patent and that said Letters Patent is hereby corrected as shown below:

On The Title Page, Item (73) Assignee, delete "Micosystems" and replace with --Microsystems--.

Signed and Sealed this
Fifteenth Day of March, 2016

Michelle K. Lee
*Director of the United States Patent and Trademark Office*